United States Patent
Kess

(10) Patent No.: US 7,170,293 B2
(45) Date of Patent: Jan. 30, 2007

(54) CIRCUIT ARRANGEMENT FOR TRANSFERRING SIGNALS FORM LOCAL MR COILS TO EVALUATION UNITS

(75) Inventor: Helmut Kess, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/224,831

(22) Filed: Sep. 13, 2005

(65) Prior Publication Data

US 2006/0055409 A1  Mar. 16, 2006

(30) Foreign Application Priority Data

Sep. 14, 2004 (DE) ...................... 10 2004 044 432

(51) Int. Cl.
*G01V 3/00* (2006.01)

(52) U.S. Cl. .................................................... 324/322
(58) Field of Classification Search ................ 324/322, 324/318

See application file for complete search history.

(56) References Cited

U.S. PATENT DOCUMENTS

| | | | | |
|---|---|---|---|---|
| 4,922,204 A | * | 5/1990 | Duerr et al. ................. | 324/322 |
| 5,371,466 A | * | 12/1994 | Arakawa et al. ............ | 324/322 |
| 6,320,385 B1 | | 11/2001 | Burl et al. | |

\* cited by examiner

*Primary Examiner*—Louis M. Arana
(74) *Attorney, Agent, or Firm*—Schiff Hardin LLP

(57) ABSTRACT

A circuit arrangement for connection of at least two local coils of a magnetic resonance apparatus with at least two evaluation units has at least two sheath wave barriers arranged so that magnetic fields caused by them substantially cancel one another.

11 Claims, 1 Drawing Sheet

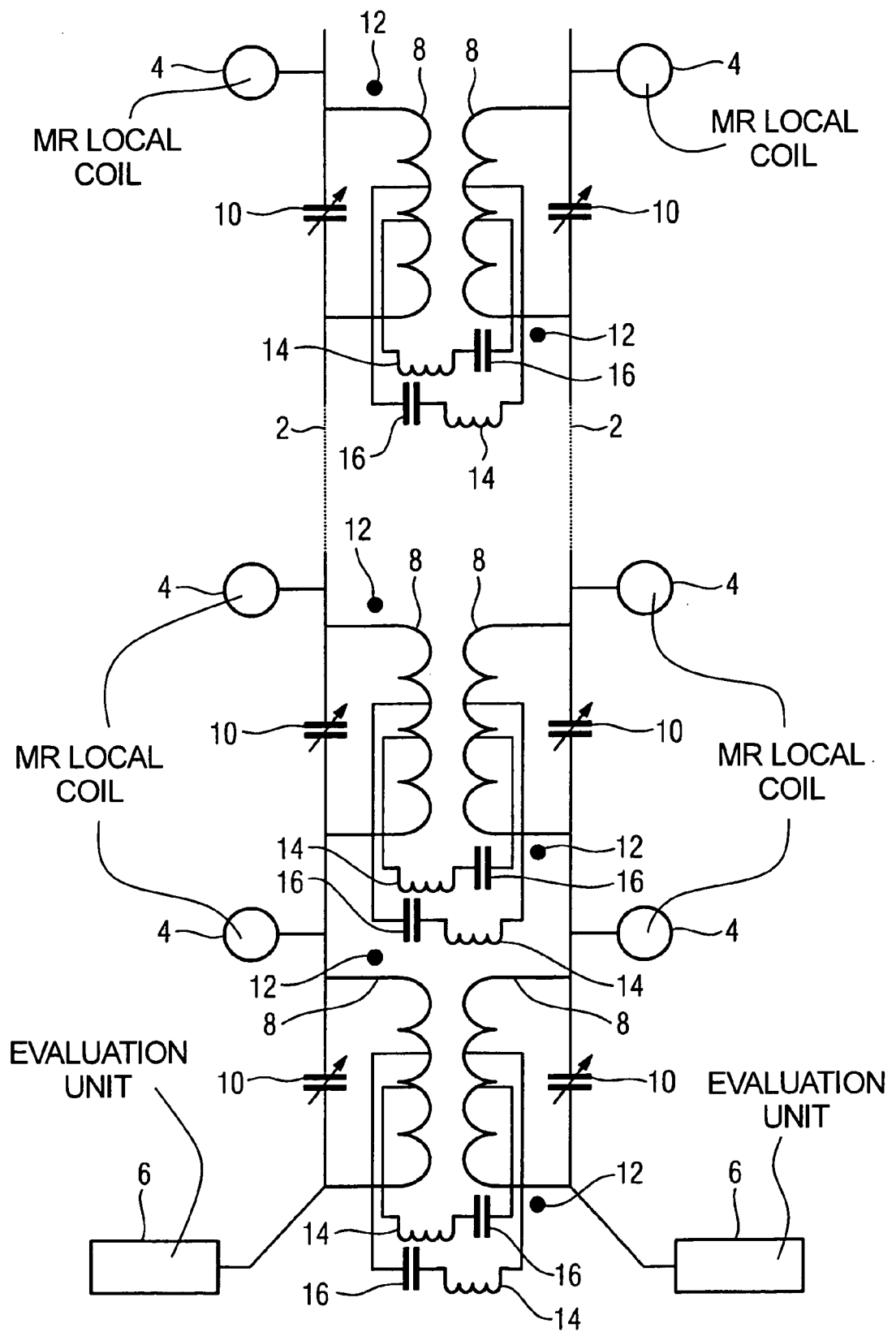

CIRCUIT ARRANGEMENT FOR TRANSFERRING SIGNALS FORM LOCAL MR COILS TO EVALUATION UNITS

BACKGROUND OF THE INVENTION

1. Field of the Invention

The present invention concerns a circuit for connection of at least two local coils of a magnetic resonance apparatus with at least two evaluation units via two separate lines (conductors).

2. Description of the Prior Art

In magnetic resonance examinations, magnetic resonance signals of an examined patient frequently are acquired by means of local coils positioned close to the patient. The radio-frequency signals are acquired by the local coils and transmitted via a circuit arrangement to the evaluation units of the magnetic resonance apparatus. Arrangements known as local coil arrays are composed of multiple local coils that are simultaneously operated, which leads to interferences due to RF coupling between signal lines in the circuit arrangement. The signal lines generally are shielded to prevent such interferences. An example of a shielded signal line is a coaxial cable. Given the use of such cables, however, the problem exists that sheath waves and sheath wave currents that cause interferences can propagate on the shield conductor. Large sheath wave currents can lead, for example, to an endangerment of the patient or interfere with components. One possibility to prevent such interferences is the use of sheath wave barriers. These can be formed, for example, by windings of the shielded cable formed into a coil and connected in parallel with a capacitive element. The parallel circuit represents a high impedance for sheath waves so that propagation thereof is prevented. It is too complicated, however, to provide every signal line with an individual shield and sheath wave barrier. In particular the cramped space relationships in the imaging apparatus represents a limitation as to the use of sheath wave barriers.

One possibility is to provide a number of cables with a common shield and to decouple them via one sheath wave barrier. Interferences still result, however, due to the cables being wound into coils, for example on further cables or local coils.

SUMMARY OF THE INVENTION

An object of the present invention to provide a circuit arrangement that allows signals to be transferred largely free of interference from local coils to evaluation units.

The above object is achieved in accordance with the invention in an circuit arrangement for connecting at least two local coils of a magnetic resonance (MR) apparatus with at least two evaluation units respectively via two separate lines, wherein at least one sheath wave barrier is connected in each of the lines, and wherein the sheath wave barriers are configured so that magnetic fields respectively produced by the sheath wave barriers substantially cancel each other.

At least two sheath wave barriers thus are located between the local coils and the evaluation units, the sheath wave barriers being arranged so that their magnetic fields approximately cancel one another. Such an arrangement prevents crosstalk between the fields generated by the sheath wave barriers and thus prevents unwanted signal coupling to other parts of the circuit arrangement.

In an embodiment, each sheath wave barrier is formed by a shielded cable wound into a coil. In particular a cable used for connection of the local coil with the respective evaluation unit can be wound into a coil for this purpose. This embodiment is particularly cost-effective and can be executed in a space-saving manner.

In a further embodiment, a capacitive element is connected in parallel with each coil. With the coil, this forms a parallel oscillating circuit and thus suppresses the propagation of sheath waves on the shield conductor of the shielded cable.

In a further embodiment, the sheath wave barriers are arranged in pairs. This is particularly advantageous given the use of multiple sheath wave barriers. A component composed of two sheath wave barriers thus can be repeated arbitrarily often in the circuit arrangement, for example after each local coil. Generation of interferences thus is also effectively prevented for longer signal paths.

In a further advantageous embodiment, the two coils forming a pair are respectively wound in different directions. Compensation of the magnetic fields in the environment of both sheath wave barriers is thereby achieved in a simple manner. Mutual influencing is thus suppressed.

In a further embodiment of the invention, the respective outer conductors of the coils forming a pair are connected via a coil and a capacitive element. This connection suppresses crosstalk of signal lines running next to one another

DESCRIPTION OF THE DRAWINGS

The single FIGURE is a circuit diagram of a circuit arrangement constructed and operating in accordance with principles of the present invention.

DESCRIPTION OF THE PREFERRED EMBODIMENTS

As shown in the FIGURE, a number of local coils 4 are connected to two cable lines 2. Each of the cable lines 2 has a shielding within which multiple inner conductors run. Only the shieldings of the cable lines 2 are shown as shield conductors in the FIGURE. The measurement signals of the local coils 2 are transmitted via the inner conductors to an evaluation unit 6. The cable lines 2 connect the coils 4 with the evaluation unit 6. Only three local coils 4 are shown on each side.

A sheath wave barrier is arranged between two local coils 4 as well as between the lowermost local coil 4 and the evaluation unit 6 in each cable line 2. This is formed by the cable line 2 (thus both the inner conductors and the shielding) being wound into a coil 8 that is connected in parallel with a capacitive element 10. The capacitive element 10 is electrically connected with the shielding. An arrangement of sheath wave barriers in pairs results by the parallel connection of both cable lines 2 to the local coils 4. The sheath wave barriers of a pair have opposite winding directions, as indicated by points 12. The magnetic fields of the coils of the sheath wave barriers thereby cancel one another relative to the environment. Crosstalk between sheath wave barrier pairs is thereby prevented.

The coils 8 of a pair of sheath wave barriers are connected via two inductive elements 14 and two capacitors 16. Direct crosstalk of the signals between the two cable lines 2 is thereby prevented. Moreover the potentials of both cable lines 2 are isolated from one another in the described arrangement. For example, the formation of potential loops is thereby prevented. For symmetry, the inductive element 14 and the capacitor 16 are located in opposite sequence in the two connections between the coils 8.

The described circuit arrangement in particular has the advantage that multiple inner conductors can be contained in a shielding. Even given constricted space relationships as in the examination volume of a magnetic resonance apparatus, a number of cable lines 2 can run closely next to one another without the signals carried thereby mutually influencing one another.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circuit arrangement comprising:
   at least a first input and a second input, said first and second inputs being adapted for connection to respective MR local coils;
   at least a first output and a second output, said first and second outputs being adapted for connection to respective evaluation units;
   a first signal line between said first input and said first output and a second line between said second input and said second output, said first and second signal lines being separate from each other in terms of respective current flows therein;
   at least one first sheath wave barrier connected exclusively in said first signal line and at least one second sheath wave barrier connected exclusively in said second signal line, each of said at least one first sheath wave barrier and said at least one second sheath wave barrier producing a magnetic field, and said at least one first sheath wave barrier and said at least one second sheath wave barrier being configured relative to each other so that the respective magnetic fields produced thereby substantially cancel each other.

2. A circuit arrangement as claimed in claim 1 comprising a plurality of first sheath wave barriers and a plurality of second sheath wave barriers with each first sheath wave barrier forming a pair with one second sheath wave barrier.

3. A circuit arrangement as claimed in claim 2 wherein each of said at least one first sheath wave barrier and said at least one second sheath wave barrier comprises a shielded cable wound to form a coil.

4. A circuit arrangement as claimed in claim 3 comprising a capacitive element connected in parallel with each coil.

5. A circuit arrangement as claimed in claim 2 wherein the respective coils of each first sheath wave barrier and each second sheath wave barrier in a pair have respectively different winding directions.

6. A circuit arrangement as claimed in claim 1 wherein each of said at least one first sheath wave barrier and said at least one second sheath wave barrier comprises a shielded cable wound to form a coil.

7. A circuit arrangement as claimed in claim 6 comprising a capacitive element connected in parallel with each coil.

8. A circuit arrangement as claimed in claim 1 wherein each of said first line and said second line comprises a shielded cable.

9. A circuit arrangement as claimed in claim 8 wherein each shielded cable comprises a plurality of inner conductors surrounded by a shield conductor.

10. A circuit arrangement as claimed in claim 9 comprising a plurality of first sheath wave barriers and a plurality of second sheath wave barriers with each first sheath wave barrier forming a pair with one second sheath wave barrier, and comprising an inductive element and a capacitor connecting the shield conductors of the respective coils of the first and second sheath wave barriers in said pair.

11. A circuit arrangement as claimed in claim 10 comprising a further inductive element and a further capacitor connecting the shield conductors of the respective coils of said first sheath wave barrier and said sheath wave barrier in said pair.

* * * * *